United States Patent [19]

Bishop et al.

[11] Patent Number: 5,415,932

[45] Date of Patent: May 16, 1995

[54] PYROTECHNIC SHEET MATERIAL HAVING AN OUTER PROTECTIVE BARRIER LAYER OF A PASSIVATING MATERIAL

[75] Inventors: Charles A. Bishop, Middlesbrough; Steven J. Graham; Graeme A. Leiper, both of Ayrshire, all of United Kingdom

[73] Assignee: ICI PLC, London, United Kingdom

[21] Appl. No.: 101,052

[22] Filed: Aug. 4, 1993

[30] Foreign Application Priority Data

Aug. 4, 1992 [GB] United Kingdom ............... 9216517

[51] Int. Cl.6 .......................... B32B 7/00; F42B 3/18
[52] U.S. Cl. ................................ 428/335; 102/202.7; 280/728 R; 428/336; 428/422; 428/469; 428/472; 428/626
[58] Field of Search ............... 428/336, 332, 334, 421, 428/422, 335, 457, 472, 461, 463, 469, 615, 621, 626, 642, 648, 649; 524/330; 102/202.5, 202.7; 280/741, 728

[56] References Cited

U.S. PATENT DOCUMENTS 5,253,584 10/1993 Allford ........................... 102/202.7

Primary Examiner—Paul J. Thibodeau
Assistant Examiner—Stephen Sand
Attorney, Agent, or Firm—Cushman Darby Cushman

[57] ABSTRACT

The invention provides pyrotechnic sheet material comprising a substrate of oxidizing polymeric film, for example a film of halogenopolymer, having a layer of oxidizable material, for example magnesium on at least part of its surface. The substrate and the oxidizable material are capable of reacting together exothermically on ignition. The oxidizable material is covered with an overlying protective barrier layer of passivating material comprising a passive metal or an oxide of a passive metal. The barrier layer is effective to extend the storage life of the pyrotechnic sheet material by providing a dense non-porous oxide layer which prevents oxidization of the oxidizable material until ignition of the pyrotechnic sheet material occurs.

9 Claims, 1 Drawing Sheet

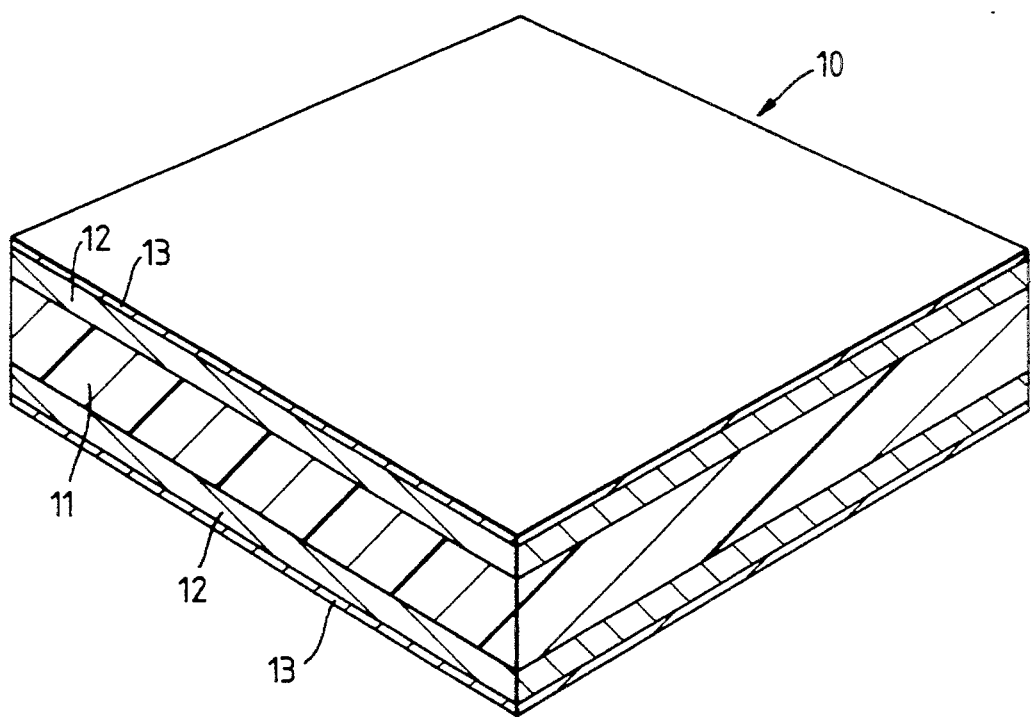

PYROTECHNIC SHEET MATERIAL HAVING AN OUTER PROTECTIVE BARRIER LAYER OF A PASSIVATING MATERIAL

FIELD OF INVENTION

This invention relates to pyrotechnic material in sheet form and to a method of manufacturing the said material. The material is useful in ignition systems in, for example, gas generators, rocket motors, shock wave transmission tubes, and heat generators of inflators for gas bags of vehicle occupancy safety restraint systems.

BACKGROUND OF INVENTION

Pyrotechnic sheet material consisting of one or more substrate layers of oxidizing polymeric film having a layer of oxidizable material on at least a portion of at least one surface of the, or each, substrate layer, the polymeric film and the oxidizable material being conjointly capable of reacting together exothermically on ignition, has been described in PCT International Publications Nos WO 90/10611 and WO 90/10724.

The use of the aforesaid pyrotechnic sheet material to ignite a propellant charge has been described in European patent application no 92300835-3, now European Patent publication No. 505024, and hybrid inflators containing gas heating elements comprising the pyrotechnic sheet material have been described in United Kingdom patent application no 9302503.9, now United Kingdom published specification GB 2264772A.

The preferred oxidizable material of the aforedescribed pyrotechnic sheet material comprises a metal selected from the group consisting of lithium, sodium, magnesium, beryllium, calcium, strontium, barium, zirconium, and alloys comprising any one or more thereof, the most preferred metal being magnesium. Advantageously the metal is vapour-deposited on the film by known methods, the amount of metal being preferably substantially stoichiometric at the location of the film underlying the metal.

We have found that in the aforedescribed pyrotechnic sheet material the layer of oxidizable material oxidizes at a slow but significant rate when stored under normal atmospheric conditions. This effectively progressively diminishes the reaction energy available from the material and would seriously reduce the storage period during which reliable performance could be guaranteed. Thus a layer of magnesium as the oxidizing layer of pyrotechnic sheet material will oxidize at a rate of about 3 microns per year from the surface and if the material were used in a vehicle occupant safety restraint system, where a guaranteed storage life of up to 15 years is required, the thickness of magnesium layer required would be >60 microns instead of 15–20 microns required for reaction with the oxidizing polymer. We have further found that the oxidizable material can be advantageously passivated by a dense non-porous layer of metal oxide or a metal which has a dense, non-porous oxide, thereby significantly increasing the storage life of the pyrotechnic sheet material.

SUMMARY OF INVENTION

In accordance with the present invention a pyrotechnic sheet material comprises a substrate of oxidizing polymeric film; a layer of oxidizable material on at least a portion of at least one surface thereof, the substrate and the oxidizable material being conjointly capable of reacting together exothermically on ignition; and a protective barrier layer of passivating material overlying the said oxidizable material, said passivating material comprising a passive metal or an oxide of a passive metal.

In this context a passive metal is a metal on which is readily formed a dense oxide layer that prevents further oxidization of the metal. Examples of suitable passive metals include titanium, aluminium, silicon, chromium, nickel, tin, indium, zinc, copper and alloys comprising any one or more thereof.

Passive metals may be deposited as a layer on the surface of the oxidizable material by vapour deposition at low pressure either by direct evaporation or by magnetron sputtering, the latter being preferred. Oxides of passive metals may be deposited either by direct magnetron sputtering or formed during metal sputtering. Alternatively, metals or oxides may be deposited by magnetron sputtering or from a vapour of a passive metal compound which decomposes or oxidizes to form a passive metal or passive metal oxide. Coating of films by high vacuum vapour-deposition (including magnetron sputtering) are well known in the art of web coating and have been described in the book "Web Processing and Converting Technology" (Van Nostrand Reinhold Company)—chapter entitled "High Vacuum Roll Coating" by Ernst K Harwig. It is generally preferable to deposit a layer of passive metal on the oxidizable material and to allow the passive metal to form a protective dense oxide layer on its surface in storage. Pyrotechnic sheet material having such a protective barrier layer can be stored without significant oxidization of the reactive oxidizable material. The useful life of devices containing the pyrotechnic sheet can thereby be significantly extended.

The deposited layer of passivating material may conveniently and effectively be from 2 to 200 nanometers, preferably 5 to 60 nanometers thick.

Preferably the substrate of oxidizing polymeric film is coated on both sides with oxidizable material but in some cases, for example to facilitate heat sealing of thermoplastic film, portions of the film may be left uncoated.

A particularly preferred oxidizing polymeric film is that used in the pyrotechnic sheet material described in PCT International Publications Nos. WO 90/10611 and WO 90/10724. The oxidizing polymeric film described therein contains atoms chemically bound therein selected from the group consisting of halogens (especially fluorine), oxygen, sulphur, nitrogen and phosphorous. Preferred films comprise fluoropolymer such as polytetrafluoroethylene (PTFE) but other suitable polymeric films include those comprising polychlorotrifluoroethylene, polyhexafluoropropylene, copolymers of trifluoroethylene and hexafluoropropylene either with each other or with tetrafluoroethylene, copolymers of hexafluoropropylene and vinylidene fluoride, copolymers of tetrafluoroethylene and perfluoropropylene, copolymers of chlorotrifluoroethylene and vinylidene fluoride, homopolymers of perfluoropropylene, copolymers of perfluoropropylene and vinylidene fluoride, trichloroethylene homopolymers, copolymers of trichloroethylene and vinylidene fluoride, mixtures of two or more such polymers or mixtures of any one or more of such polymers with PTFE.

The preferred oxidizable material comprises the aforementioned metals used in the pyrotechnic sheet material described in PCT International Publications Nos WO 90/10611 and WO 90/10724. The preferred metal is magnesium or an alloy thereof. The ratio of metal to the substrate polymer film is preferably substantially stoichiometric at the location of the film underlying the metal. The ignition reaction of a typical pyrotechnic sheet consisting of PTFE and magnesium on ignition can be expressed by the equation $$(C_2F_4)n + 2 nMG \rightarrow 2 nMgF_2 + 2 nC$$

This reaction releases 5.98 Megajoules/kilogram of reactant material. The amount of material in the passivating layer will generally be too small to have any significant effect on the reaction and, in particular, it will not give rise to any toxic products which could affect any occupant in a vehicle having a safety restraint system containing the pyrotechnic sheet material.

The rate of energy release on ignition varies inversely with the thickness of the pyrotechnic sheet material and, accordingly, the thickness will be chosen to attain desired energy release. Thus the polymeric film will generally have a thickness of 6 to 60 microns, typically 10–50 microns and the total thickness of the oxidizable metal layer or layers will have the thickness of 2 to 30 microns, typically 10 to 15 microns.

The pyrotechnic sheet material of the invention may be used in any convenient shape or configuration, for example, in flat sheets, strips, tapes or discs, or it may be folded, wrapped, wrinkled, pleated, corrugated, fluted or wrapped around a former such as a rod or tube.

If desired, for enhanced rate and violence of burning, the sheet may be provided with spacer elements, for example protrusions formed on the surface. These spacer elements are effective to prevent intimate contact of adjacent surfaces for example of overlying sheets and thus facilitate rapid combustion of the pyrotechnic material by allowing hot gas and flame to travel ahead of the burning face and initiate the material at downstream positions.

The invention also includes a method of manufacturing a pyrotechnic sheet material which comprises depositing a layer of oxidizable material on at least a portion of at least one surface of oxidizing polymeric film, the polymeric film and the oxidizable material being conjointly capable of reacting together exothermically on ignition, and depositing on the oxidizable material an overlying layer of passivating material comprising a passive metal or an oxide of a passive metal.

Preferably the oxidizable material is vapour-deposited at low pressure on a polymer substrate by direct evaporation or magnetron sputtering. The passivating material is preferably vapour-deposited on the oxidizable material by direct evaporation or by magnetron sputtering of a passive metal, or a passive metal compound which decomposes or oxidizes to form a passive metal or passive metal oxide, or by magnetron sputtering of a passive metal oxide.

BRIEF DESCRIPTION OF THE DRAWING

The invention is further described by way of example only with reference to the accompanying drawing which is a diagrammatic perspective, part-sectional view of the pyrotechnic sheet material of the invention.

DETAILED DESCRIPTION

Referring to the drawing, pyrotechnic sheet material designated generally by the number 10 consists of a substrate 11 of oxidizing polymeric film, for example of polychlorotrifluoroethylene, coated on each side with a vapour-deposited layer of oxidizable metal for example magnesium 12. Each layer of oxidizable metal is coated with a vapour-deposited layer of passive metal 13.

SPECIFIC EXAMPLES

Embodiments of the invention are further described in the following Examples.

Example 1

The pyrotechnic sheet material of this Example consists of a 20 micron thick substrate film of polychlorotrifluoroethylene. Each side of the film is coated with a 10 micron thick vapour-deposited layer of magnesium, the total magnesium amounting to 60% by mass of the substrate. Each magnesium layer is surface coated with a 50 nanometer thick layer of aluminium.

In the preparation of the sheet material magnesium is vapour-deposited onto the substrate polymeric film by direct evaporation at high vacuum and the aluminium is subsequently deposited on the magnesium by magnetron sputtering wherein an ionised stream of Argon gas at low pressure was accelerated onto an aluminium cathode in a magnetic field to eject aluminium atoms or particles at high energy which were deposited on the magnesium surface. Alternatively the aluminium may be vapour deposited on the magnesium by direct evaporation at low pressure.

Example 2

The pyrotechnic sheet material of this Example is the same as Example 1 except that the substrate is polytetrafluoroethylene and the passive metal coating of aluminium is replaced by a 30 nanometer thick layer of titanium deposited by magnetron sputtering.

Example 3

A pyrotechnic sheet material was prepared as described in Example 1 except that the coating of aluminium was vapour-deposited on the magnesium by direct evaporation at low pressure.

We claim:

1. A pyrotechnic sheet material comprising:
   a substrate of oxidizing polymeric film;
   an oxidizable material which oxidizes continuously on exposure to atmospheric air applied as a layer on at least a portion of at least one surface of said polymeric film, said polymeric film and said oxidizable material being conjointly capable of reacting together exothermically on ignition; and
   a protective barrier layer of passivating material overlying said oxidizing material, said passivating material being a passive metal or oxide thereof, said passive metal being selected from the group consisting of titanium, aluminum, silicon, chromium, nickel, tin, indium, zinc, copper and alloys thereof, one surface of said barrier layer being in contact with said oxidizable layer and the other surface being exposed, and said barrier layer being effective to reduce the migration of atmospheric air to said oxidizable material.

2. A pyrotechnic sheet material as claimed in claim 1 wherein the layer of passivating material is a vapor-deposited layer.

3. A pyrotechnic sheet material as claimed in claim 1 wherein the layer of passivating material is a layer deposited by magnetron sputtering.

4. A pyrotechnic sheet material as claimed in claim 1 wherein the layer of passivating material is from 2 to 200 nanometers thick.

5. A pyrotechnic sheet material as claimed in claim 1 wherein the substrate of oxidizing polymeric film is coated on both sides with a layer of oxidizable material and each layer of oxidizable material is coated with a layer of passivating material.

6. Pyrotechnic sheet material as claimed in claim 1 wherein the oxidizing polymeric film comprises fluoropolymer selected from the group consisting of polytetrafluoroethylene, polychlorotrifluoroethylene, polyhexafluoropropylene, copolymers of trifluoroethylene and hexafluoropropylene, copolymers of trifluoroethylene and tetrafluoroethylene, copolymers of hexafluoropropylene and tetrafluoroethylene, copolymers of hexafluoropropylene and vinylidene fluoride, copolymers of tetrafluoroethylene and perfluoropropylene, copolymers of chlorotrifluoroethylene and vinylidene fluoride, homopolymers of perfluoropropylene, copolymers of perfluoropropylene and vinylidene fluoride, trichloroethylene homopolymers, copolymers of trichloroethelene and vinylidene fluoride and mixtures of two or more such polymers;

the oxidizable material comprises a metal selected from the group consisting of lithium, sodium, magnesium, beryllium, calcium, strontium, barium, zirconium, and alloys comprising any of such metals vapor-deposited on the said polymeric film; and the passivating material comprises vapour-deposited metals selected from the group consisting of titanium, aluminum, silicon, chromium, nickel, tin, indium, zinc, copper and alloys comprising any or more thereof.

7. Pyrotechnic sheet material as claimed in claim 1 comprising a substrate film of oxidizing polymer 6 to 60 microns thick having vapour-deposited on each side an oxidizable material comprising a layer of magnesium 2 to 30 microns thick.

8. A pyrotechnic sheet material according to claim 1, wherein said oxidizable material is selected from the group consisting of lithium, sodium, magnesium, beryllium, calcium, strontium, barium, zirconium and alloys thereof.

9. A pyrotechnic sheet material according to claim 8, wherein said oxidizable material is magnesium.

* * * * *